(12) United States Patent
Camsari et al.

(10) Patent No.: US 10,607,674 B2
(45) Date of Patent: Mar. 31, 2020

(54) STOCHASTIC SWITCHING DEVICE WITH ADJUSTABLE RANDOMNESS

(71) Applicants: Purdue Research Foundation, West Lafayette, IN (US); The Regents of the University of California, Oakland, CA (US)

(72) Inventors: Kerem Yunus Camsari, Lafayette, IN (US); Supriyo Datta, West Lafayette, IN (US); Sayeef Salahuddin, Walnut Creek, CA (US)

(73) Assignees: Purdue Research Foundation, West Lafayette, IN (US); THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 16/170,335

(22) Filed: Oct. 25, 2018

(65) Prior Publication Data

US 2019/0130954 A1    May 2, 2019

Related U.S. Application Data

(60) Provisional application No. 62/577,693, filed on Oct. 26, 2017.

(51) Int. Cl.

| G11C 11/16 | (2006.01) |
| H01L 43/10 | (2006.01) |
| H01L 27/22 | (2006.01) |
| H01L 43/02 | (2006.01) |
| G06F 7/58 | (2006.01) |
| G11C 11/54 | (2006.01) |

(52) U.S. Cl.
CPC .......... *G11C 11/1659* (2013.01); *G06F 7/588* (2013.01); *G11C 11/161* (2013.01); *G11C 11/1673* (2013.01); *G11C 11/54* (2013.01); *H01L 27/228* (2013.01); *H01L 43/02* (2013.01); *H01L 43/10* (2013.01)

(58) Field of Classification Search
CPC ... G11C 11/1659; G11C 11/16; G11C 11/161; G11C 11/1673; G11C 11/54; H01L 43/10; H01L 27/228; H01L 43/02
See application file for complete search history.

(56) References Cited

U.S. PATENT DOCUMENTS

| 10,170,172 B2* | 1/2019 | Lee ...................... G11C 11/161 |
| 2010/0039136 A1* | 2/2010 | Chua-Eoan ............. G11C 11/16 326/38 |
| 2013/0272059 A1* | 10/2013 | Lin ...................... G11C 11/1659 365/158 |
| 2017/0365313 A1* | 12/2017 | Augustine ............... G06N 3/049 |
| 2018/0239590 A1* | 8/2018 | Gupta ..................... G06F 7/588 |

* cited by examiner

*Primary Examiner* — David Lam
(74) *Attorney, Agent, or Firm* — Piroozi-IP, LLC

(57) ABSTRACT

A two-terminal stochastic switch is disclosed. The switch includes a magnetic tunnel junction (MTJ) stack, an access switch controlled by a first terminal and coupled to the MTJ stack, such that when the access switch is on, electrical current flows from a first source coupled to the MTJ stack, through the MTJ stack, and through the access switch to a second source, and a digital buffer coupled to the MTJ stack and the access switch which is configured to transform an analog signal associated with a voltage division across the MTJ stack and the access switch to a digital signal, output of the digital buffer forming a second terminal.

20 Claims, 12 Drawing Sheets

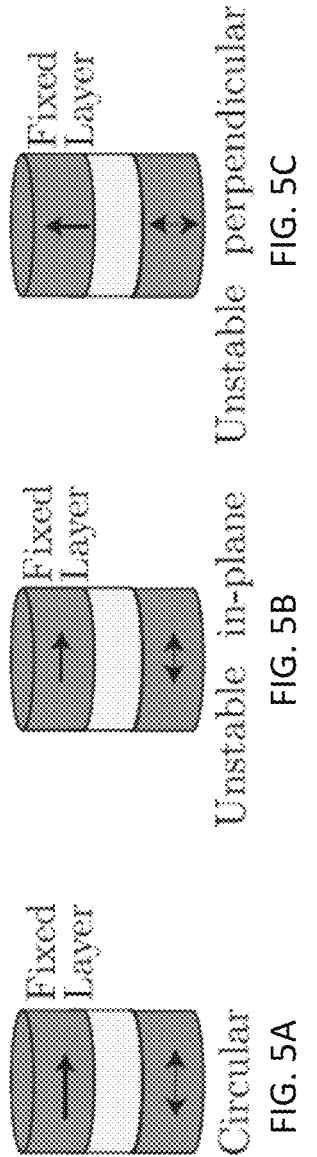

STOCHASTIC SWITCHING DEVICE WITH ADJUSTABLE RANDOMNESS

CROSS-REFERENCE TO RELATED APPLICATIONS

The present patent application is related to and claims the priority benefit of U.S. Provisional Patent Application Ser. No. 62/577,693, filed Oct. 26, 2017, the contents of each of which are hereby incorporated by reference in its entirety into the present disclosure.

STATEMENT REGARDING GOVERNMENT FUNDING

This invention was not made with government support.

TECHNICAL FIELD

The present disclosure generally relates to electronic switching, and in particular, to a stochastic and probabilistic switching mechanism.

BACKGROUND

This section introduces aspects that may help facilitate a better understanding of the disclosure. Accordingly, these statements are to be read in this light and are not to be understood as admissions about what is or is not prior art.

Typically, a semiconductor switch is constructed from an arrangement that provides a deterministic output. For example, silicon-based switches behave in a manner such that when a predetermined input is provided, the output is deterministic (e.g., a high or a low). Nowadays, with an ever-challenging requirement generated by the explosion of computing demands, the typical semiconductor switches are failing to answer the call of data exchange in such applications as big-data, machine learning and artificial intelligence, Internet-of-things (IoT), and other data intensive operations. In response to these challenges, other technologies are now being investigated. One such technology is spin-torque transfer (STT)-based memory devices. Such STT-based devices typically use magnetic tunnel junction (MTJ) switches. These switches aim to alleviate the shortcomings of traditional switches such as power and cycle time.

In contrast to deterministic switching, in certain applications such as stochastic neural networks, it is desired to have a stochastic-probabilistic switching mechanism. One example of such an application is a tunable random number generator (tunable RNG) that can be used as a building block for building stochastic neural networks to be used for Machine Learning and Quantum Computing applications. However, the typical solutions for RNG applications are typically bulky and suffer from the same challenges discussed in typical computing circumstances.

Therefore, there is an unmet need for a novel approach to answer the challenges posed by situations in which stochastic and probabilistic switching mechanisms are needed.

SUMMARY

A two-terminal stochastic switch is disclosed. The stochastic switch includes a magnetic tunnel junction (MTJ) stack, which includes a first magnetic layer with a fixed a polarity (pinned layer (magnetic PL)) in a first magnetic direction. The MTJ stack further includes a non-magnetic layer (NML) vertically positioned adjacent to the magnetic PL, and a second magnetic layer vertically positioned adjacent the NML with selective polarity (free layer (magnetic FL)). When the magnetic polarity of the magnetic FL is along the first magnetic direction, the MTJ stack is in a parallel (P) configuration presenting an electrical resistance to current flow below a resistance threshold. When the magnetic polarity of the magnetic FL is opposite the first direction, the MTJ stack is in an anti-parallel (AP) configuration presenting an electrical resistance to current flow higher than the resistance threshold. The stochastic switch also includes an access switch controlled by a first terminal and coupled to the MTJ stack, such that when the access switch is on, electrical current flows from a first source coupled to the MTJ stack, through the MTJ stack, and through the access switch to a second source. The stochastic switch further includes a digital buffer coupled to the MTJ stack and the access switch and configured to transform an analog signal associated with a voltage division across the MTJ stack and the access switch to a digital signal, output of the digital buffer forming a second terminal. The magnetic FL is configured to have an energy barrier that allows stochastic switching of polarity, thereby causing stochastic flipping between P and AP configurations.

A method of generating a signal by a two-terminal stochastic switch is also disclosed. The method includes passing a current through a magnetic tunnel junction (MTJ) stack, the MTJ stack includes a first magnetic layer with a fixed a polarity (pinned layer (magnetic PL)) in a first magnetic direction. The MTJ stack further includes a non-magnetic layer (NML) vertically positioned adjacent to the magnetic PL, and a second magnetic layer vertically positioned adjacent the NML with selective polarity (free layer (magnetic FL)). When the magnetic polarity of the magnetic FL is along the first magnetic direction, the MTJ stack is in a parallel (P) configuration presenting an electrical resistance to current flow below a resistance threshold. When the magnetic polarity of the magnetic FL is opposite the first direction, the MTJ stack is in an anti-parallel (AP) configuration presenting an electrical resistance to current flow higher than the resistance threshold. The method also includes switching a current by an access switch controlled by a first terminal and coupled to the MTJ stack, such that when the access switch is on, electrical current flows from a first source coupled to the MTJ stack, through the MTJ stack, and through the access switch to a second source. The method also include converting an analog signal associated with a voltage division across the MTJ stack and the access switch to a digital signal by a digital buffer coupled to the MTJ stack and the access switch, output of the digital buffer forming a second terminal. The magnetic FL is configured to have an energy barrier that allows stochastic switching of polarity, thereby causing stochastic flipping between P and AP configurations.

BRIEF DESCRIPTION OF DRAWINGS

FIGS. 5A, 5B, and 5C are schematic representations of the MTJ, each having a pinned layer and a free layer shown at different configurations (5A: an MTJ with a circular free layer that rotates in the plane in the presence of thermal noise without a preferred easy axis; 5B: an MTJ with an unstable, in-plane free-layer; and 5C: an unstable perpendicular free layer).

DETAILED DESCRIPTION

Figure 1:
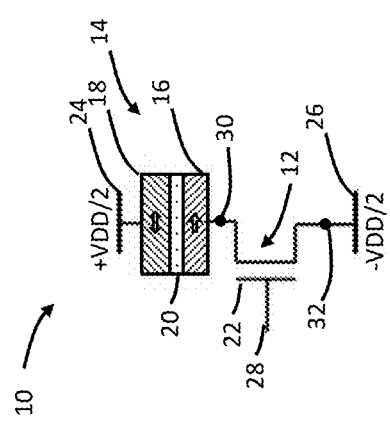
FIG. 1 is a schematic of a switched magnetic tunnel junction (MTJ) including an MTJ coupled to an access switch, according to the present disclosure.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

Referring to FIG. 1, a schematic of a typical spin-torque transfer (STT) magnetic switch 10 is shown. The STT magnetic switch 10 includes an access transistor 12 and a magnetic tunnel junction (MTJ) stack 14. The MTJ Stack 14 is positioned between a high side supply node 24 (identified at +$V_{DD}$/2, however, the voltage at the node 24 is relative) and the access transistor 12. The MTJ stack 14 is based on two nanomagnets 16 and 18 separated by a tunneling oxide barrier 20 which is a non-magnetic layer. One of the two nano-magnets typically has a fixed magnetic polarization (often referred to as the pinned layer (PL)), here shown as the nanomagnet 16. The other nano-magnet has a selectable magnetic polarization (thus called the free layer (FL)), here shown as the nanomagnet 18. The access transistor 12 is positioned between the MTJ stack 14 and a low side supply node 26 (identified at −$V_{DD}$/2, however, the voltage at the node 24 is relative) and is controlled by a transistor 22, having a gate 28, a drain 30 and a source 32 such that the drain 30 is coupled to the MTJ stack 14. When the FL's magnetization in the nanomagnet 18 is aligned with the PL's magnetization in the nanomagnet 16, the MTJ stack 14 is considered to be in a parallel orientation. However, when the FL's magnetization in the nanomagnet 18 is opposite the PL's, magnetization in the nanomagnet 16, then the MTJ stack 14 is considered to be in an anti-parallel orientation. In the parallel orientation, the resistance of the MTJ stack 14 to a through-current is less than a predetermined threshold, while in the anti-parallel orientation, the resistance of the MTJ stack 14 is higher than the predetermined threshold. The higher resistance of the anti-parallel orientation can be arbitrarily assigned a Boolean value, e.g., "1", while the lower resistance of the parallel orientation can be arbitrarily assigned a Boolean value, e.g., "0". The MTJ switch depending on its construction can result in a degree of probabilistic switching, which in most cases is viewed as an undesirable attribute. However, such a probabilistic switching profile is of interest in such applications as random number generators (RNGs).

In accordance with one approach for an RNG application, MTJ switches using unstable nanomagnet 18 having a low barrier whose magnetization $m_z$ fluctuate randomly in the range (−1,+1) is well-suited for the implementation of RNGs. These RNGs as single devices find many applications in modern electronic systems. However, in other applications, interconnected RNGs forming large scale correlated networks find new applications involving optimization, inference, and invertible Boolean logic.

Figure 2:
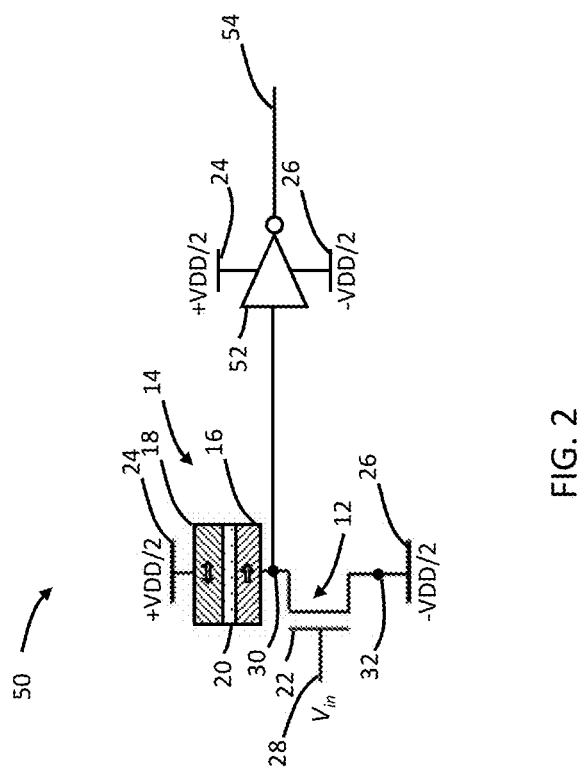
FIG. 2 is a schematic of a two-terminal stochastic switch including the switched MTJ of FIG. 1 and a buffer.

One approach to converting an MTJ stack to a purposefully probabilistic switch is to make the FL nano-magnets 18 in the MTJ stack 14 to have a lower energy barrier. A typical nano-magnet used in an MTJ stack has an energy barrier of about 40-60 kT. Energy barrier refers to the amount of energy required to flip the MTJ from the parallel to anti-parallel orientation, or vice versa. With the nano-magnet 18 chosen as an unstable magnet, the STT magnetic switch 10 stochastically moves from the parallel to the antiparallel orientations. Accordingly, and with reference to FIG. 2 a schematic is provided for a probabilistic spin logic (PSL) 50, in which the magnetic switch 10 is combined with a typical inverter 52 coupled to the drain 30 of the transistor 22 to generate a digital signal ($V_{out}$) at output 54 corresponding to the state of the STT magnetic switch 10. It should be appreciated that while in the STT magnetic switch 10, a spin transfer torque (i.e., an effect in which the magnetic orientation of the FL can be switched by passing a spin-polarized current through the FL 18) is needed, such may be absent in the PSL 50 of FIG. 2. This is because the FL 18 is unstable owing to its low barrier energy and is thus continually and stochastically flipping from a first orientation to a second orientation opposite the first. In a physical implementation of this sort of MTJ stack (i.e., the MTJ stack 14 with a stochastic nano-magnets with low-energy barriers Δ providing a nonstable nanomagnet for the FL 18) the retention time of the nanomagnet FL 18 is governed by:

$$\tau = \tau_0 \exp\left(\frac{\Delta}{kT}\right),$$

where

τ is the retention time,

τ is a material dependent parameter called attempt time (experimentally found to be on the order of 10 ps to 1 ns, Δ is the energy barrier of the nano-magnet, and kT is the energy barrier of a typical nano-magnet (generally in the range of 40 kT). The schematic of the PSL 50 leads to a two-terminal device (with $V_{in}$ at gate 28 and $V_{out}$ at output 54 as its terminals) with magnets which are low barrier ones with fluctuating magnetization giving rise to a fluctuating MTJ conductance that can be written in terms of the average conductance $G_0$ and the MTJ polarization P:

$$G_i(t)=G_0(1+P^2 m_{zi}(t)), \text{ where}$$

$m_{zi}(t)$=rand (−1,1) is the magnetization of the FL 18 whose magnetization $m_z$ fluctuates randomly between −1 and 1. The PSL 50 with its circuit shown in FIG. 2 converts this fluctuating conductance to a fluctuating voltage at the drain voltage of the transistor 22 based on the following relationship:

$$\frac{V_{DRAIN,i}(t)}{V_{DD}} = \frac{1}{2}\frac{G_0 - G_T(V_{in,i}) + P^2 G_0 m_{zi}(t)}{G_0 + G_T(V_{in,i}) + P^2 G_0 m_{zi}(t)},$$

where
$G_T$ is the conductance of the n-channel metal-oxide semiconductor (nMOS) transistor 22, controlled by its input voltage $V_{in}$ at the gate 28. It should be appreciated that the magnetization $m_{zi}$ need not be pinned by current as required by a prior art stochastic 3-terminal tunable switch, in which an input having a current $I_i(t)$ can be used to pin the stochastic output $m_{zi}(t)$ to 0 or 1 described by a characteristic sigmoidal function $$m_{zi}(t) = \text{sgn}\left(\text{rand}(-1, 1) + \frac{\tanh[I_i(t)]}{I_0}\right).$$

Even if $m_{zi}$ is completely unaffected, the simple circuit transformation provided above with respect to $V_{DRAIN,i}$ makes $V_{DRAIN,i}$ behave qualitatively similar to the prior art 3-terminal tunable switch in response to $V_{in,i}$, if the average MTJ resistance ($G_0$) is adjusted such that $G_T(V_{GS}=0.4, V_{DS}=0.4)$ is about $G_0$ when $V_{in,i}$ is about 0. Consequently, the novel two-terminal stochastic switch of the present disclosure provides a similar degree of stochastic tunability with two terminals rather than three terminals by adjusting voltage at the $V_{in,i}$ pin, as discussed further below. That is, when $V_{in,i}$ is about 0, $V_{DRAIN,i}$ provides fluctuations that are about $P^2 V_{DD}$ with an average value of 0. In addition, when $V_{in,i}$ is less than the threshold voltage, $V_{th}$, of the transistor 22 above the source voltage (i.e., less than the threshold voltage above $-V_{DD}/2$), the transistor 22 is off, which causes $G_0$ to approach 0 and $V_{DRAIN,i}$ to approach $V_{DD}/2$. Finally, when $V_{in,i}$ is greater than $V_{th}$ above $-V_{DD}/2$, the transistor 22 is on, which causes $G_0$ to approach infinity and $V_{DRAIN,i}$ to approach $-V_{DD}/2$. It should be appreciated that while here the rails are specified as $-V_{DD}/2$ and $V_{DD}/2$, the rail voltages are relative. Instead of $\pm V_{DD}/2$ the rail can simply be 0 and $V_{DD}$, in which case $V_{th}$ becomes simply the threshold voltage above 0.

Figure 3:
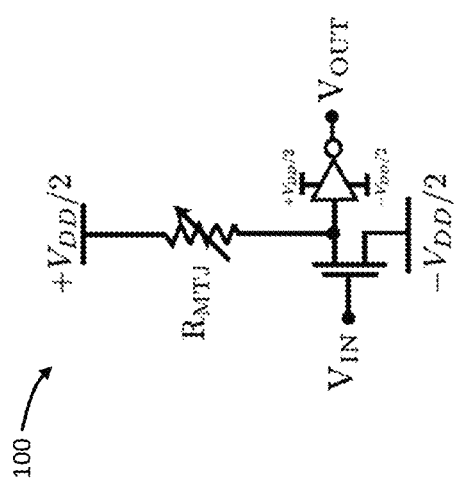
FIG. 3 is a model of the two terminal stochastic switch of FIG. 2.

These results are confirmed by the description of the graphs shown in the following figures. These following results are based on a model 100 whose circuit is shown in FIG. 3 in which the resistance of the MTJ stack 14 is based on a variable resistance $R_{MTJ}$.

Figure 4A:
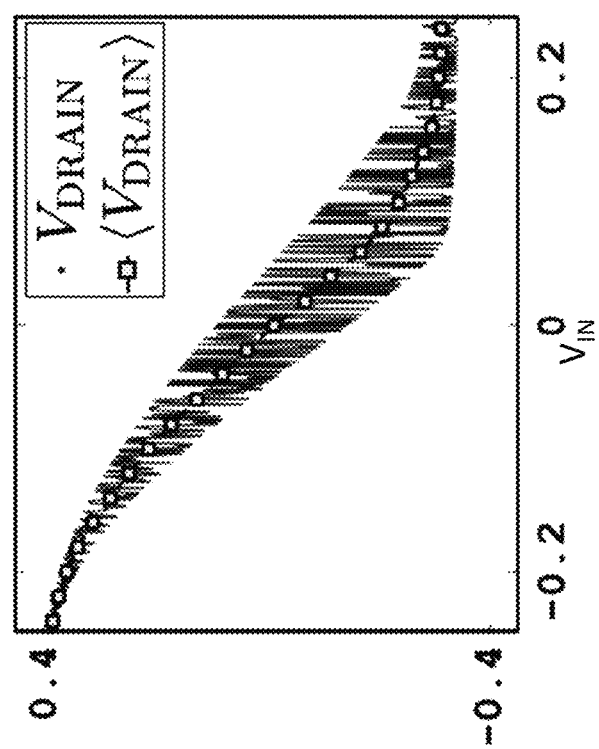
FIG. 4A is a graph of a drain voltage vs. an input voltage (one of the two terminals of the two-terminal stochastic switch) of the access switch.

With reference to FIG. 4A, a graph of $V_{DRAIN}$ measured in volts vs. $V_{in}$ also measured in volts is provided, as $V_{in}$ is swept from −0.4 V to 0.4 V in 100 ns. The lines in FIG. 4A represents the values of $V_{DRAIN}$ and the squares represent the time-averaged of the oscillation as the MTJ stack in an unstable manner moves from a parallel to an anti-parallel configuration as described above. When $V_{in}$ is high (about 0.2 V, i.e., a voltage larger than the threshold of the transistor above the source voltage ($-V_{DD}/2$)), the transistor 22 is on, causing the voltage at the drain 30 to be near $-V_{DD}/2$ (i.e., −0.4 V) and the MTJ's oscillation becomes irrelevant. In contrast, when $V_{in}$ is low (about −0.2 V, i.e., a voltage less than the threshold of the transistor above the source voltage ($-V_{DD}/2$)), the transistor 22 is off, causing the voltage at the drain 30 to be near $+V_{DD}/2$ (i.e., 0.4 V) and again the MTJ's oscillation becomes irrelevant. However, when $V_{in}$ is about 0, the resistance generated by the transistor 22 is on par with the resistance of MTJ stack 14 oscillating from parallel to anti-parallel—as discussed above the resistance of a parallel configuration is below the resistance of the anti-parallel configuration.

Figure 4B:
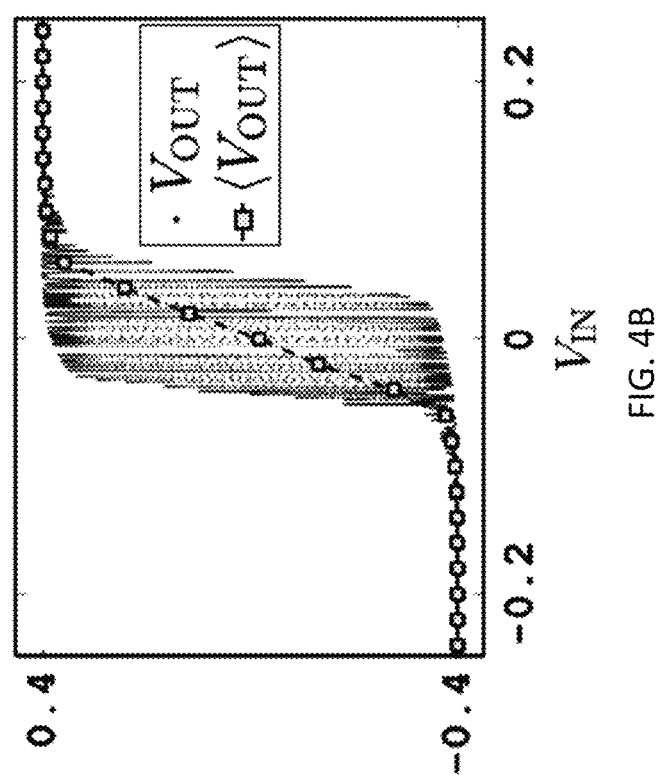
FIG. 4B is a graph of an output voltage of the buffer of FIG. 2 (the second terminal of the two-terminal stochastic switch) vs. the input voltage.

The output voltage $V_{out}$ at output 54 is based on the voltage $V_{DRAIN}$ which is provided as input to the inverter 52. With reference to FIG. 4B, a graph of $V_{OUT}$ measured in volts vs. $V_{in}$ also measured in volts is provided, as $V_{in}$ is swept from −0.4 V to 0.4 V in 100 ns. The lines in FIG. 4B represents the values of $V_{OUT}$ and the squares represent the time-averaged of the oscillation as the MTJ stack in an unstable manner moves from a parallel to an anti-parallel configuration as described above. When $V_{in}$ is high (about 0.2 V, i.e., a voltage larger than the threshold of the transistor above the source voltage ($-V_{DD}/2$)), the transistor 22 is on, causing the voltage at the drain 30 to be near $-V_{DD}/2$ (i.e., −0.4 V) and $V_{OUT}$ becomes high (i.e., about 0.4V). In contrast, when $V_{in}$ is low (about −0.2 V, i.e., a voltage less than the threshold of the transistor above the source voltage ($-V_{DD}/2$)), the transistor 22 is off, causing $V_{OUT}$ to be low (i.e., about −0.4 V). However, when $V_{in}$ is about 0, the resistance generated by the transistor 22 is on par with the resistance of MTJ stack 14 oscillating from parallel to anti-parallel—as discussed above the resistance of a parallel configuration is below the resistance of the anti-parallel configuration, thus causing an oscillation of $V_{OUT}$ on the output 54.

Figure 4C:
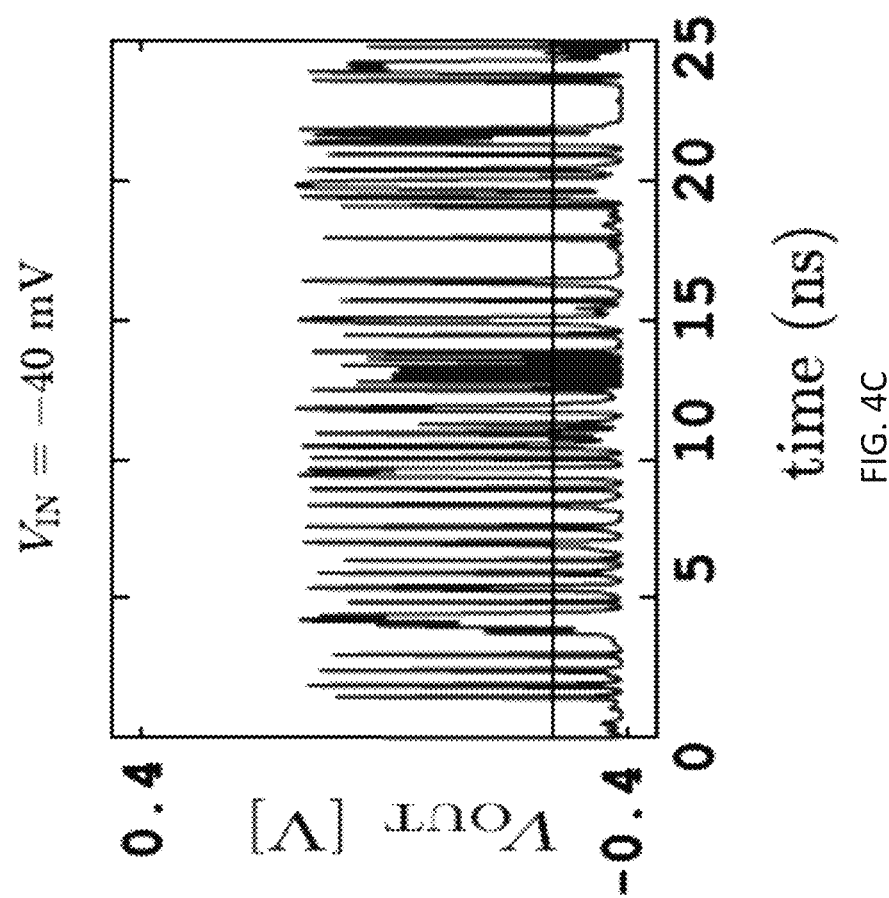
FIG. 4C is a graph of the output voltage vs. time as the input voltage transition from a high value to a low value (−40 mV).
Figure 4D:
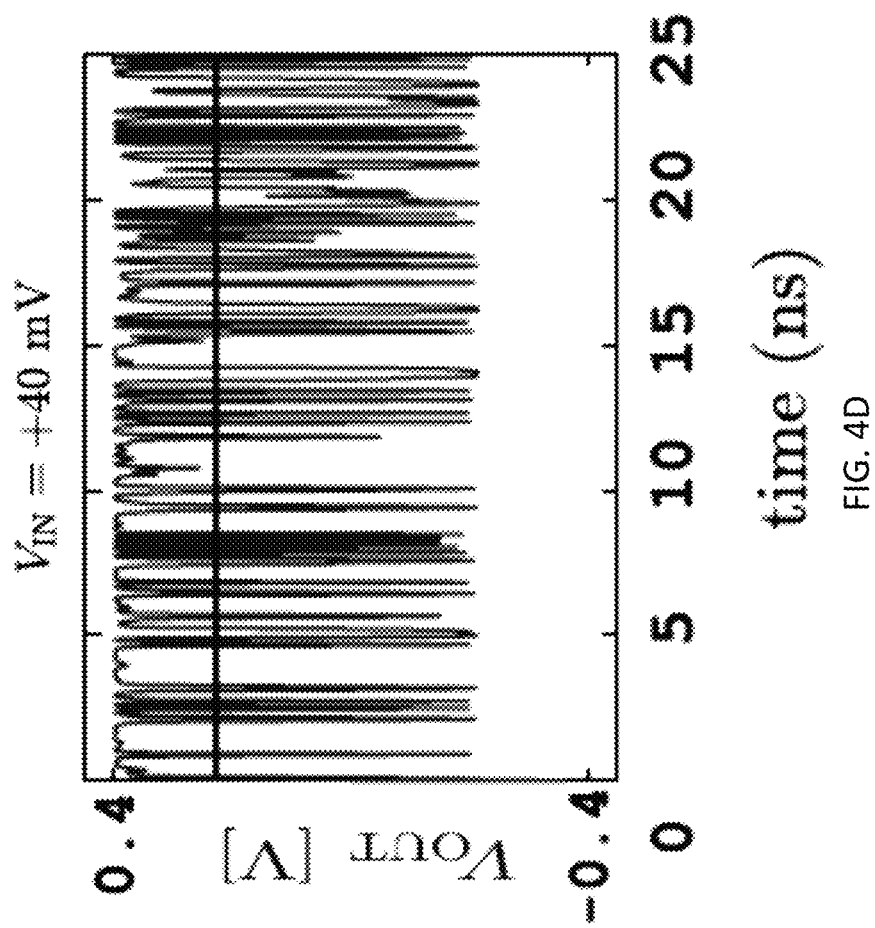
FIG. 4D is a graph of the output voltage vs. time as the input voltage transition from a low value to a high value (+40 mV).
Figure 4E:
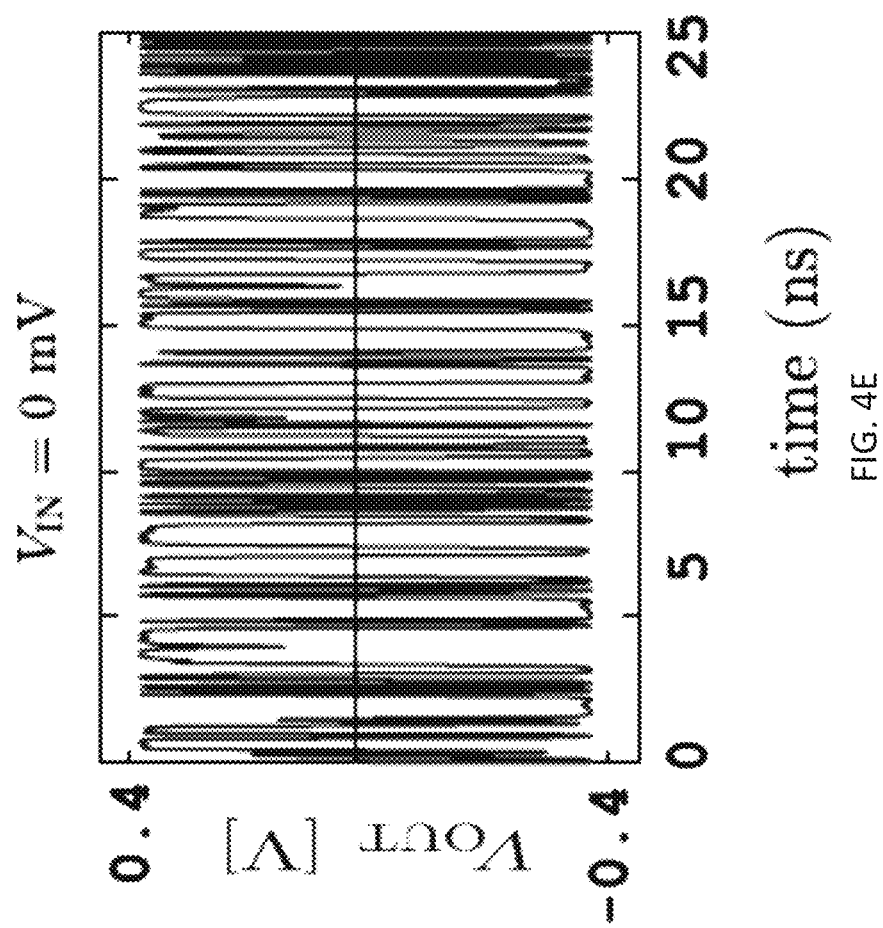
FIG. 4E is a graph of the output voltage vs. time as the input voltage is at about 0 mV.

Referring to FIGS. 4C, 4D, and 4E, time-dependent representations of the graph shown in FIG. 4B for different values of $V_{IN}$ are provided. In FIG. 4C, where $V_{IN}$ is set to a value where the transistor 22 is turned off, the probabilistic average of $V_{OUT}$ is shown by the horizontal line which is slightly above −0.4 V, indicating a substantially higher chance for $V_{OUT}$ to be at −0.4 V during the time segment when the transistor 22 is transitioning from an on state to an off state. In FIG. 4D, where $V_{IN}$ is set to a value where the transistor 22 is turned on, the probabilistic average of $V_{OUT}$ is shown by the horizontal line which is about 0.4 V, indicating a substantially higher chance for $V_{OUT}$ to be at 0.4 V during the time segment when the transistor 22 is transitioning from an off state to an on state. In FIG. 4E, where $V_{IN}$ is set to a value where the resistance of the transistor 22 is on par with the resistance of the MTJ stack 14 (whether in parallel or in the anti-parallel configuration), the probabilistic average of $V_{OUT}$ is shown by the horizontal line which is at about 0.0 V, indicating an equal chance of being parallel or anti-parallel.

It should be appreciated that with experimentally demonstrated values of the MTJ polarization P, the maximum drain voltage fluctuation is about $P^2 V_{DD}$ and which can be converted to a $\pm$VDD fluctuation by a single CMOS inverter. For P=0.59 (resulting from the exemplary choices provided in Table I provided below) fluctuations up to about 200 mV can be seen at the drain as shown in FIG. 4A, which is much larger than the expected thermal noise at room temperature across an input capacitance (C) of about 100 aF of the inverter as governed by $$\sqrt{\frac{kT}{C}}$$

which resolved to be about 5 mV. These large fluctuations in the drain voltage are able to drive the following minimum size inverter from rail-to-rail, as shown in FIG. 4B, whose mid-point is also around zero by using two supply voltages: ±VDD/2=±0.4 V.

While, emphasis has been placed on MTJs with unstable magnets, it should be appreciated any other unit that produces a stochastic resistance change could be used to obtain the desired behavior.

TABLE I

Parameters used for the two-terminal stochastic switch of the present disclosure

| Parameters | Value |
| --- | --- |
| Saturation magnetization (CoFeB) ($M_s$) | 1100 emu/cc [18] |
| Magnet diameter (Φ), thickness (t) | 22 nm, 2 nm |
| Polarization (P), TMR [$2P^2/(1 - P^2)$] | 0.59, TMR = 110% [17] |
| MTJ RA-Product ($1/G_0$ × Area) | 9 Ω-µm² [17] |
| Damping coefficient (α) | 0.01 [18] |
| Temperature (T) | 300 K |
| CMOS Models, Size | 14 nm HP-FinFET [19], nfin = 1 |
| Supply Voltage | $V_{DD}$ = 0.8 V |
| Timestep for transient sim. (SPICE) | Δt = 1 ps |

The two-terminal stochastic switch according to the present disclosure, relies on a fluctuating magnetization giving rise to a measurable resistance difference through the tunnel magnetoresistance (TMR) effect, in which electrons are able to tunnel through the very thin layer of the NML 20 (see FIG. 1), having a thickness of just a few nanometers. The TMR effect can be realized using different classes of stochastic nanomagnets. FIGS. 5A, 5B, and 5C show schematics of three possibilities for the magnetic FL 18. In FIG. 5A, a circular in-plane nanomagnet with a low coercivity (HK<<1 Oe) is shown that rotates in the plane, in the presence of thermal fluctuations. Such magnets have been experimentally shown to exhibit monodomain behavior with no preferred axis within sub-100 nm diameters. The magnets with their configuration shown in FIG. 5A are used in the stochastic switches of the present disclosure. Other configurations, however, are possible. FIG. 5B shows another possibility in which elliptical in-plane magnets are used with a coercive field (HK>>1 Oe) which exhibit telegraphic resistance changes. Yet another possibility is shown in FIG. 5C which shows perpendicular magnets that provide another telegraphic behavior.

Figure 6:
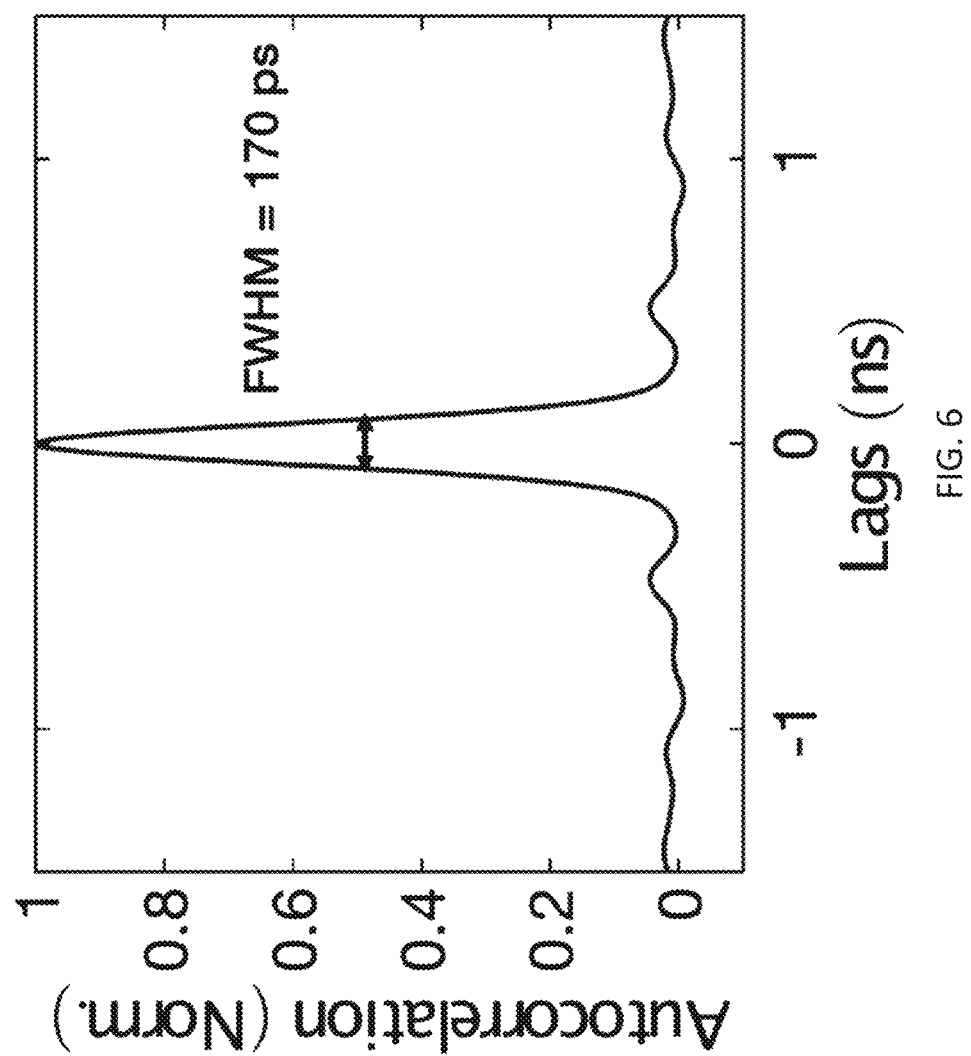
FIG. 6 is a normalized autocorrelation of the switching of the two-terminal switch vs. time around 0 (measured in ns), according to the present disclosure.

The stochastic-ness nature of the output of the two-terminal switch of the present disclosure can be quantified by an autocorrelation function of the output. A normalized autocorrelation function (unitless) of the output vs. a timing lag measured in ns is provided in FIG. 6. A Full Width Half Maximum (FWHM) point shows a width of about 170 ps indicating the two-terminal stochastic switch loses its memory and is ready to provide a new uncorrelated random output.

For modeling purposes, a bias-independent MTJ model is used based on and described by Eq. for conductance ($G_i(t)$), provided above, within a simulation platform, e.g., the SPICE framework. Additionally, bias-dependence of the MTJ can be included using voltage dependent TMR and polarization data within the same framework. The stochastic magnetization dynamics is modeled by the stochastic Landau-Lifshitz-Gilbert equation:

$$(1+\alpha^2)d\frac{\hat{m}}{dt} = -|\gamma|\hat{m} \times \vec{H} - \alpha|\gamma|(\hat{m} \times \hat{m} \times \vec{H}) + \frac{1}{qN}(\hat{m} \times \vec{I_s} \times \hat{m}) + \left(\frac{\alpha}{qN}(\hat{m} \times \vec{I_s})\right),$$

where
α is the damping coefficient,
q is the electron charge,
γ is the electron gyromagnetic ratio,
$\vec{I_s}$=$PI_c$ $\hat{z}$ is the spin current along the fixed layer ($\hat{z}$),
$I_c$ is the charge current flowing through the MTJ,
N is the number of spins in the magnet,
MsVol./µB, µB is the Bohr magneton,
$\vec{H}$ is the effective field as is provided as $-4\pi M_s m_x \hat{x}+\vec{H}_n$, where
$\hat{x}$ is the out-of-plane direction of the magnet. $\hat{H}_n$ is the isotropic thermal noise field, uncorrelated in three directions:

$$(H_n^{x,y,z})^2 = \frac{2\alpha kT}{|\gamma|M_s \text{Vol.}}[Oe^2/Hz]$$

In one exemplary embodiment the transistors are based on 14 nm HP-FINFET PREDICTIVE TECHNOLOGY MODELS.

It should be appreciated, as discussed above, the operation of the two-terminal stochastic switch discussed herein does not rely on the magnetization being pinned, even when the transistor 22 (see FIG. 1) is fully on.

To achieve specific functionalities, the two-terminal stochastic switch, according to the present disclosure, can be interconnected into a network in accordance with a synaptic matrix [J] and a bias vector {h}, as known by a person having ordinary skill in the art, based on large-scale correlated networks which are created by interconnecting these two-terminal stochastic switches such that the inputs {I} are obtained from the bias vector {h} and a weighted sum of the outputs {m}, scaled by a constant $I_0$ is provided by:

$$\frac{I_i(t)}{I_0} = h_i(t) + \sum J_{ij} m_j(t),$$

where different functionalities are implemented based on a predetermined synaptic matrix [J] and bias vector {h} which can be implemented via hardware or software by use of resistive or capacitive networks. For this purpose a crossbar architecture with a transimpedance amplifier appropriate for driving the two-terminal switches is used. The resistors are chosen to implement specific predetermined [J], {h}.

Figure 7:
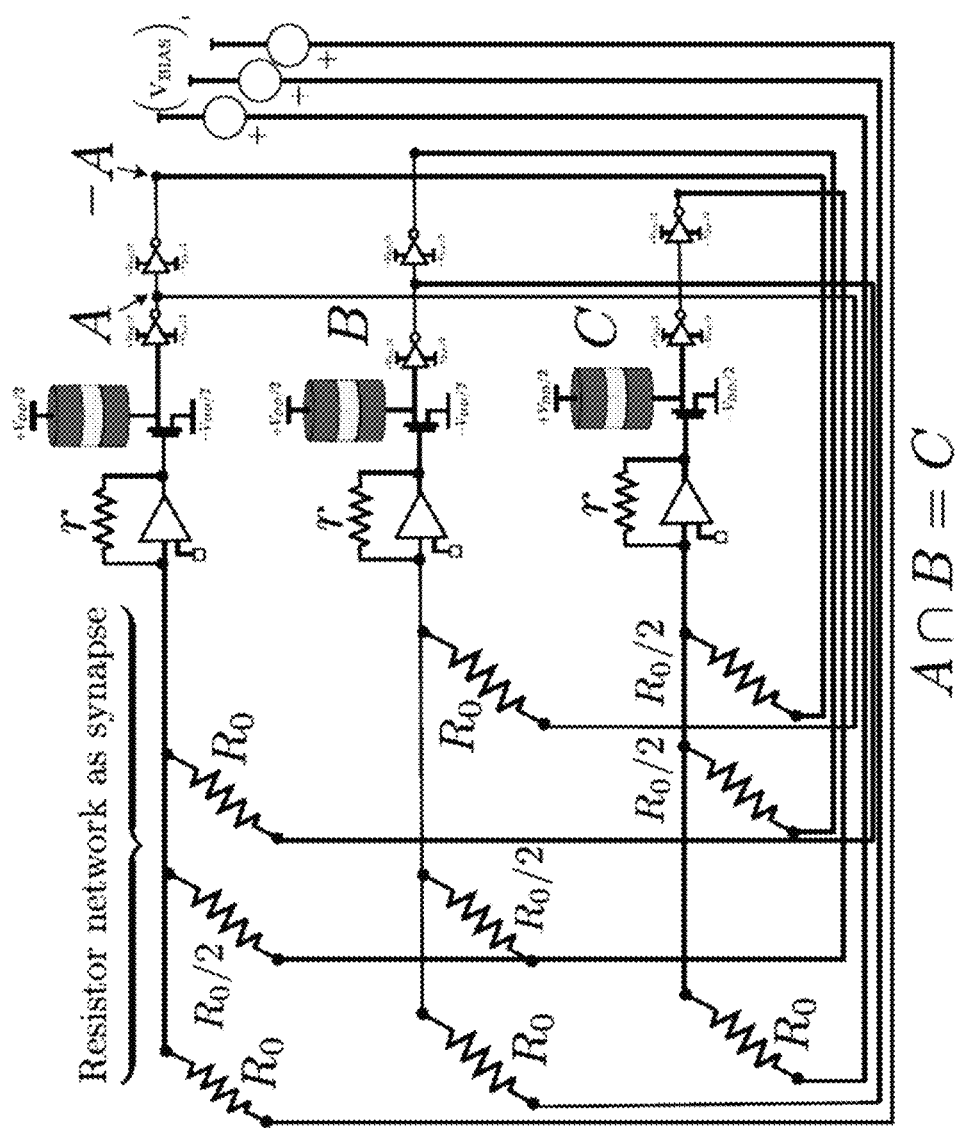
FIG. 7 is a schematic of a network in accordance with a synaptic matrix and a bias vector for an AND gate, according to the present disclosure.
Figure 8:
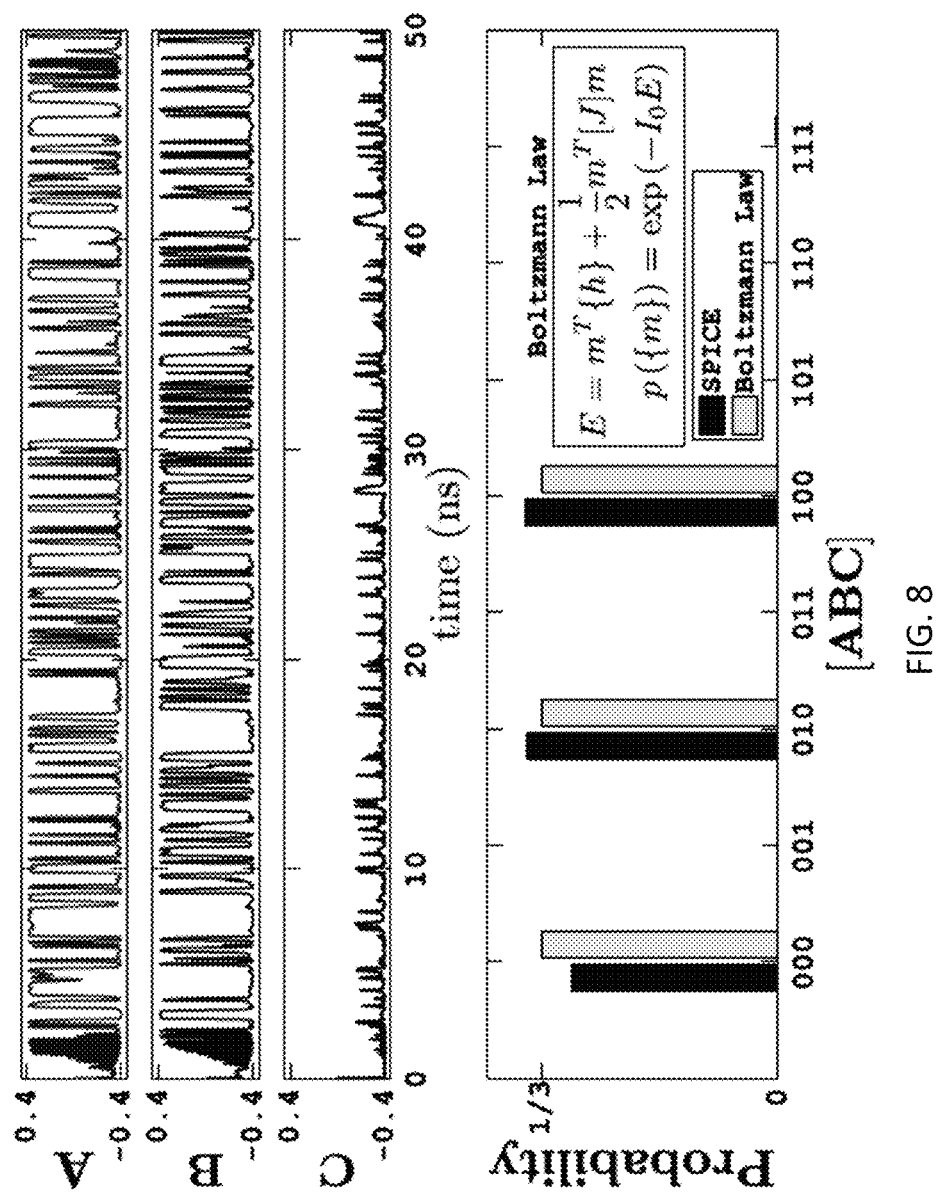
FIG. 8 is a complex set of graphs of stochastic timing and histogram of probability for values of A (first input of the AND gate of FIG. 7), B (second input of the AND gate of FIG. 7), and C (output of the AND gate of FIG. 7).

Referring to FIG. 7, an exemplary embodiment of a schematic of a network in accordance with a synaptic matrix [J] and a bias vector {h} as provided above is shown. The network provided in FIG. 7 can be used for a full circuit implementation of an invertible AND gate using a crossbar array resistor-network and embedded MTJ based neurons. The inverting nature of the summing inserts an overall minus sign to the weights. The ratio of resistances $r/R_0$ maps to the "interaction strength", as $I_0$, discussed above. The two-terminal stochastic switching network shown in FIG. 7 can be designed to provide an AND gate operation, discussed with respect to FIG. 8, with the two-terminal stochastic switches representing inputs A, B and the output C. These AND gates can be operated in the usual forward mode, where A and B are clamped to specific values (0 or 1) through the bias vector {h}, and the network results in C assuming the corresponding value as dictated by the AND truth table: {00→0}, {01→0}, {10→0}, {11→1}.

One remarkable and surprising property of this PSL architecture is its inverse operation. In the inverse operation, if the output C is biased to a low but yet allowing its stochastic variances, A and B then assume appropriate values even when the exact value of A and B are not unique. For example, if C is stochastically biased to zero, the combination {AB} cycles through all three possibilities {00}, {01} and {10} as evident from the histogram in FIG. 8, in which a histogram of probability is shown for various values of A, B, and C of an AND gate (where A and B are inputs and C is the output), as it relates to the network of FIG. 7. The top panel shows the resultant stochastic values of A, the middle panel shows the resultant stochastic values of B, and the bottom panel shows the stochastic biasing of C to 0. When C (see FIG. 7) is clamped to 0 (i.e., $-V_{DD}/2$), A and B fluctuate among the three possible configurations. The circuit simulation is in good agreement with the Boltzmann Law for a universal model for a two-terminal stochastic switch whose dimensionless variables ($I_0$, $h_i$, [J]) are mapped to the hardware parameters.

The network shown in FIG. 7 is then extremely useful in the reverse direction for a multitude of applications, e.g., its use in multiplication can be used to generate potential inputs. For example, in a more complex network, if C is stochastically set to 15, then A and B can take the stochastic values of 1 and 15, 3 and 5, 5 and 3, and 15 and 1. Such a reverse stochastic convergence to inputs can be extremely beneficial in multitude of applications such as neural network, big data, etc.

Those having ordinary skill in the art will recognize that numerous modifications can be made to the specific implementations described above. The implementations should not be limited to the particular limitations described. Other implementations may be possible.

The invention claimed is:

1. A two-terminal stochastic switch, comprising:
   a magnetic tunnel junction (MTJ) stack, comprising:
   a first magnetic layer with a fixed a polarity (pinned layer (magnetic PL)) in a first magnetic direction,
   a non-magnetic layer (NML) vertically disposed adjacent to the magnetic PL,
   a second magnetic layer vertically disposed adjacent the NML with selective polarity (free layer (magnetic FL)), wherein when the magnetic polarity of the magnetic FL is along the first magnetic direction, the MTJ stack is in a parallel (P) configuration, and when the magnetic polarity of the magnetic FL is opposite the first direction, the MTJ stack is in an anti-parallel (AP) configuration,
   an access switch controlled by a first terminal adapted to be controlled by a voltage source operating in an analog fashion between a first voltage ($V_1$) and a second voltage ($V_2$) and coupled to the MTJ stack, such that when the first terminal is at $V_2$, electrical current stochastically flows from a first source coupled to the MTJ stack, through the MTJ stack, and through the access switch to a second source and when the first terminal is at $V_1$, electrical current stochastically stops flowing through the access switch, and
   a digital buffer coupled to the MTJ stack and the access switch and configured to transform an analog signal associated with a voltage division across the MTJ stack and the access switch to a digital signal, output of the digital buffer forming a second terminal,
   wherein the magnetic FL is configured to have an energy barrier that allows stochastic switching of polarity, thereby causing stochastic flipping between P and AP configurations,
   when voltage at the first terminal varies between $V_1$ and $V_2$, randomness of the stochastic output at the second terminal is at a maximum when voltage at the first terminal is about $(V_1+V_2)/2$, and wherein randomness of the stochastic output at the second terminal is at a minimum when voltage at the first terminal is about $V_1$ or $V_2$.

2. The two-terminal stochastic switch of claim 1, wherein the access switch is a metal oxide semiconductor field effect transistor (MOSFET).

3. The two-terminal stochastic switch of claim 2, wherein the MOSFET is an N-channel, and the MOSFET is turned on by applying a threshold voltage ($V_{th}$) above the second source.

4. The two-terminal stochastic switch of claim 2, wherein the MOSFET is a P-channel, and the MOSFET is turned on by applying a threshold voltage ($V_{th}$) below the first source.

5. The two-terminal stochastic switch of claim 1, wherein the magnetic FL has an energy barrier of between 0 and 15 kT at room temperature where k is Boltzmann constant and T is temperature.

6. The two-terminal stochastic switch of claim 5, wherein the magnetic FL is made from the group consisting essentially of Ni, Fe, NiFe alloys, Co, CoFe, CoFeB, CoCrPt, and a combination thereof.

7. The two-terminal stochastic switch of claim 1, wherein material of the magnetic PL is selected from the group consisting essentially of Ni, Fe, NiFe alloys, Co, CoFe, CoFeB, CoCrPt, and a combination thereof.

8. The two-terminal stochastic switch of claim 1, wherein the digital buffer is an inverter.

9. The two-terminal stochastic switch of claim 1, wherein the second terminal oscillates between a digital 1 and 0 stochastically when the access switch transitions between an on state and an off state.

10. The two-terminal stochastic switch of claim 9, wherein the oscillation is characterized by an autocorrelation function having a Full Width Half Maximum (FWHM) point at a width of about 170 ps.

11. A method of generating a signal by a two-terminal stochastic switch, comprising:
   passing a current through a magnetic tunnel junction (MTJ) stack, the MTJ stack comprising:
   a first magnetic layer with a fixed a polarity (pinned layer (magnetic PL)) in a first magnetic direction,
   a non-magnetic layer (NML) vertically disposed adjacent to the magnetic PL,
   a second magnetic layer vertically disposed adjacent the NML with selective polarity (free layer (magnetic FL)), wherein when the magnetic polarity of the magnetic FL is along the first magnetic direction, the MTJ stack is in a parallel (P) configuration, and when the magnetic polarity of the magnetic FL is opposite the first direction, the MTJ stack is in an anti-parallel (AP) configuration, switching the current by an access switch controlled by a first terminal adapted to be controlled by a voltage source operating in an analog fashion between a first voltage ($V_1$) and a second voltage ($V_2$) and coupled to the MTJ stack, such that when the first terminal is at $V_2$, electrical current stochastically flows from a first source coupled to the MTJ stack, through the MTJ stack, and through the access switch to a second source and when the first terminal is at $V_1$, electrical current stochastically stops flowing through the access switch, and converting an analog signal associated with a voltage division across the MTJ stack and the access switch to a digital signal by a digital buffer coupled to the MTJ stack and the access switch, output of the digital buffer forming a second terminal, wherein the magnetic FL is configured to have an energy barrier that allows stochastic switching of polarity, thereby causing stochastic flipping between P and AP configurations, when voltage at the first terminal varies between $V_1$ and $V_2$, randomness of the stochastic output at the second terminal is at a maximum when voltage at the first terminal is about $(V_1+V_2)/2$, and wherein randomness of the stochastic output at the second terminal is at a minimum when voltage at the first terminal is about $V_1$ or $V_2$.

12. The method of claim 11, wherein the access switch is a metal oxide semiconductor field effect transistor (MOSFET).

13. The method of claim 12, wherein the MOSFET is an N-channel, and the MOSFET is turned on by applying a threshold voltage ($V_{th}$) above the second source.

14. The method of claim 12, wherein the MOSFET is a P-channel, and the MOSFET is turned on by applying a threshold voltage ($V_{th}$) below the first source.

15. The method of claim 11, wherein the magnetic FL has an energy barrier of 0 and 15 kT at room temperature where k is Boltzmann constant and T is temperature.

16. The method of claim 15, wherein the magnetic FL is made from the group consisting essentially of Ni, Fe, NiFe alloys, Co, CoFe, CoFeB, CoCrPt, and a combination thereof.

17. The method of claim 11, wherein material of the magnetic PL is selected from the group consisting essentially of Ni, Fe, NiFe alloys, Co, CoFe, CoFeB, CoCrPt, and a combination thereof.

18. The method of claim 11, wherein the digital buffer is an inverter.

19. The method of claim 11, wherein the second terminal oscillates between a digital 1 and 0 stochastically when the access switch transitions between an on state and an off state.

20. The method of claim 19, wherein the oscillation is characterized by an autocorrelation function having a Full Width Half Maximum (FWHM) point at a width of about 170 ps.

* * * * *